United States Patent
Rudolf

(10) Patent No.: US 8,358,743 B2
(45) Date of Patent: Jan. 22, 2013

(54) METHOD AND DEVICE FOR DETERMINING THE LEAKAGE RESISTANCE OF AT LEAST ONE WIRE OF A SUBSCRIBER LINE HAVING A NUMBER OF WIRES IN A COMMUNICATION NETWORK

(75) Inventor: Dollinger Rudolf, Munich (DE)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 1429 days.

(21) Appl. No.: 11/993,654

(22) PCT Filed: Jun. 7, 2006

(86) PCT No.: PCT/EP2006/062974
§ 371 (c)(1),
(2), (4) Date: Dec. 21, 2007

(87) PCT Pub. No.: WO2006/136494
PCT Pub. Date: Dec. 28, 2006

(65) Prior Publication Data
US 2009/0262905 A1    Oct. 22, 2009

(30) Foreign Application Priority Data
Jun. 23, 2005  (DE) .......................... 10 2005 029 271

(51) Int. Cl.
*H04M 1/24* (2006.01)
(52) U.S. Cl. ...................................... 379/30; 379/27.01
(58) Field of Classification Search .... 379/27.01–27.02, 379/30
See application file for complete search history.

(56) References Cited

U.S. PATENT DOCUMENTS

| | | | | |
|---|---|---|---|---|
| 5,073,920 A | * | 12/1991 | Masukawa et al. | 379/30 |
| 5,440,612 A | * | 8/1995 | Siligoni et al. | 379/27.01 |
| 5,864,602 A | * | 1/1999 | Needle | 379/22.02 |
| 5,956,386 A | * | 9/1999 | Miller | 379/27.02 |

FOREIGN PATENT DOCUMENTS

| | | |
|---|---|---|
| DE | 4125883 | 2/1993 |
| EP | 0052220 | 5/1982 |
| EP | 0721722 | 7/1996 |
| EP | 0762713 | 3/1997 |

OTHER PUBLICATIONS

A. Bonini et al., "Gain dynamics of doped-fiber amplifiers for added and dropped signals".

* cited by examiner

*Primary Examiner* — Mohammad Islam
(74) *Attorney, Agent, or Firm* — Laurence A. Greenberg; Werner H. Stemer; Ralph E. Locher

(57) ABSTRACT

While determining a leak resistance of a subscriber connection line provided, for example, with two wires in a communication network, a capacitor connected between two said wires is discharged prior to measuring leakage currents. For this purpose, prior to be connected to a high resistance of the other wire, the measurable wire and the other mentioned wire are supplied with a constantly falling and increasing voltage. For that, the final value of said tensions is determined in such a way that, when the connection to the high resistance of the other wire is produced, the voltage of said wire is equal to 0 volt. The leakage current is measured only when the discharge process is over, thereby making it possible to avoid an incorrect measurement caused by a current coming from the capacitor.

12 Claims, 2 Drawing Sheets

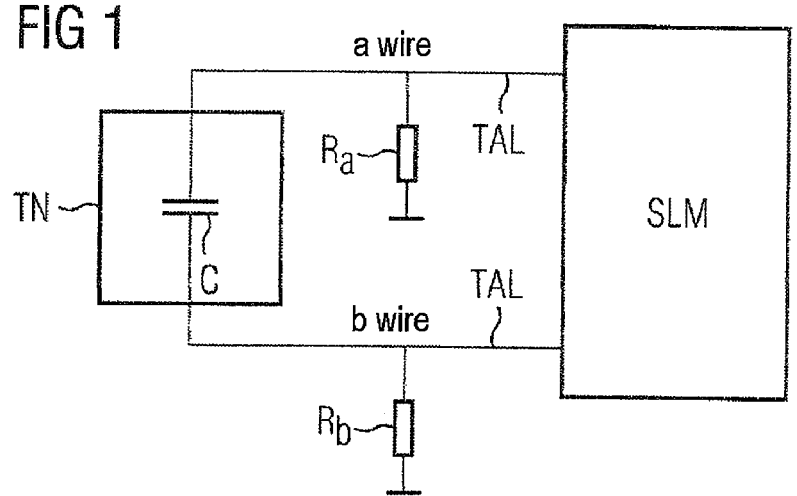
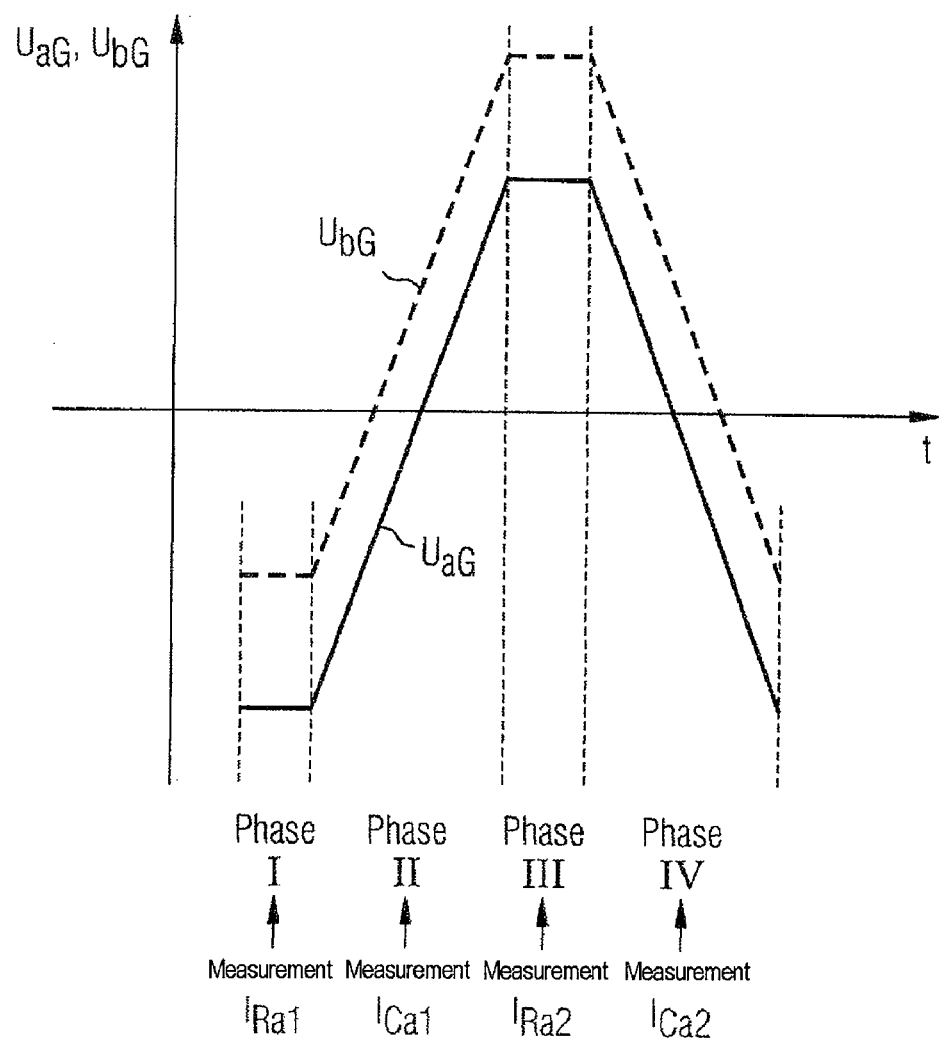

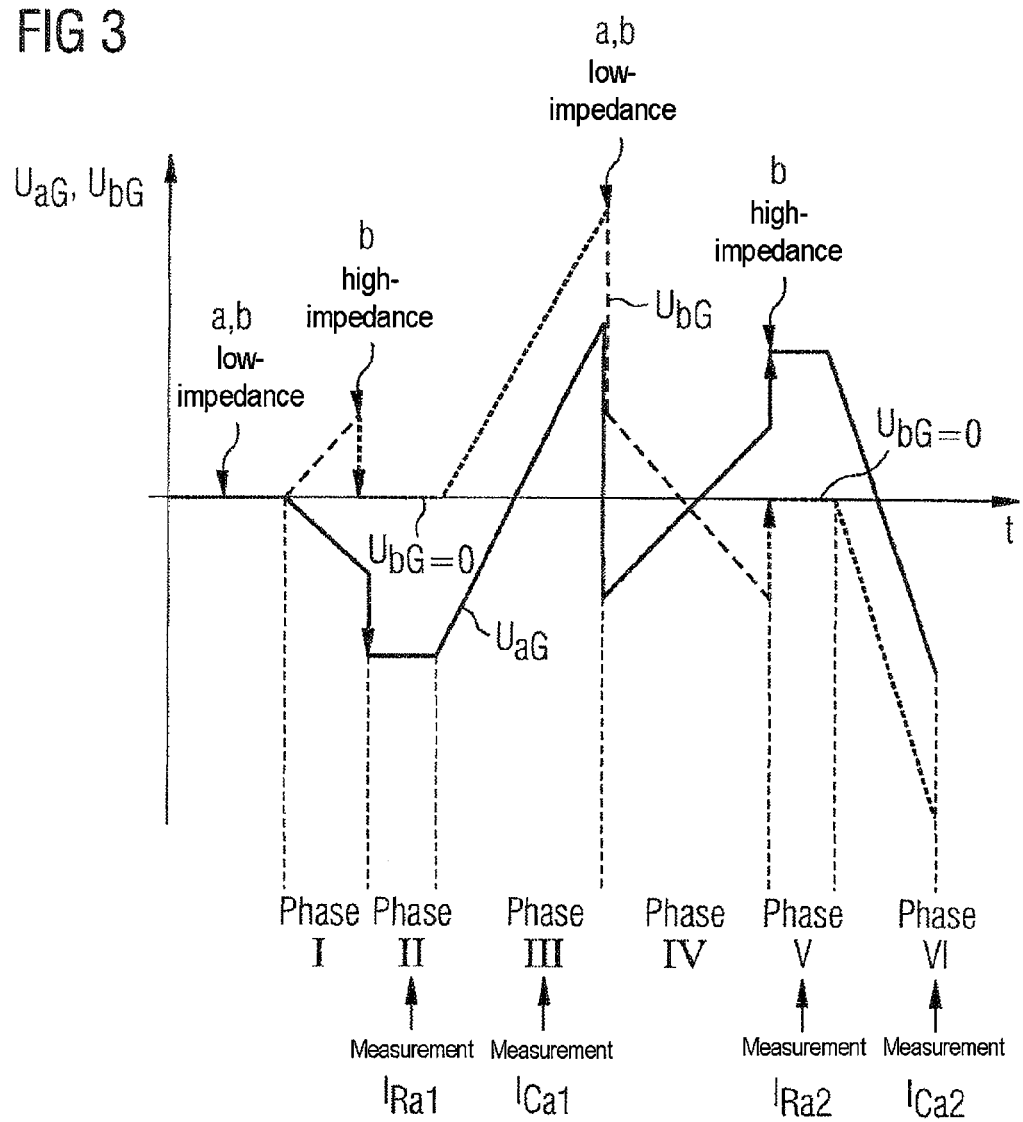

METHOD AND DEVICE FOR DETERMINING THE LEAKAGE RESISTANCE OF AT LEAST ONE WIRE OF A SUBSCRIBER LINE HAVING A NUMBER OF WIRES IN A COMMUNICATION NETWORK

FIELD OF TECHNOLOGY

The present disclosure relates to a method and a device for determining the leakage resistance of at least one wire of a subscriber line having a number of wires in a communication network.

BACKGROUND

The operators of communication networks such as, for example, the conventional telephone network, often provide the subscribers or customers, apart from the transmission of useful data (of voice in the telephone network), with a multiplicity of further facilities or subscriber performance features. These features include, e.g. conference circuits, the transmission or suppression of directory numbers, call forwarding or the charge pulse.

In the case of complaints by the subscriber or also in the case of a routine check of these assured features, the electrical characteristics of the subscriber lines (TAL), among other things, must be measured by the operator of the telephone network. During such a measurement, however, connected terminals must not audibly respond.

Two important electrical parameters of the subscriber line are the ohmic leakage resistance between line and ground and the so-called transmission-line constant, the capacitance between line and ground.

FIG. 1 then shows by way of example the basic diagrammatic structure of a current analogue subscriber connection of a telephone network.

In this arrangement, the respective subscribers TN are connected to a subscriber line module SLM allocated to the switching equipment via the corresponding subscriber line TAL. The subscriber line TAL itself usually consists of conventional twin copper wires, the two terminals being designated as a wire and b wire, respectively.

The circuit of the terminal connected to the subscriber line TAL corresponds to a capacitance C connected between the ends of the a wire and b wire in almost all terminals. This capacitance C is also called ringer capacitance since it is the component of the terminal which acquires the alternating voltage applied to the subscriber line TAL by the switching center in the event of an incoming call, that is to say which detects the incoming call.

Furthermore, FIG. 1 shows two leakage resistances Ra and Rb which represent the connections for the leakage currents between the two wires a and b of the subscriber line and ground.

In a convention method for determining these leakage resistances Ra and Rb and of the transmission-line constant (RC measurement), a problem occurs: in the current method, the ringer capacitance C also falsifies the measured values of the leakage currents on the wires (a and b) of the subscriber line TAL.

This measuring method according to the prior art will be described in the text which follows, with reference to FIG. 2.

FIG. 2 represents by way of example the sequence in time of a method for determining both the resistance between line and ground and the capacitance between line and ground on the a wire of a subscriber line of an analogue telephone connection.

During an RC measurement of the a wire, the second wire b is initially switched to high impedance. Following this, a voltage having the variation with time shown in FIG. 2 is applied to the line wire a to be measured.

In this process, a constant (in the present example negative) voltage $U_{aG}$ is first applied to the a wire. During this phase (I), the ohmic leakage current $I_{Ra1}$ between wire a and ground is measured.

Following this, a constant rising voltage $U_{aG}$ is applied to the a wire (phase II). During this second phase, the variation of the capacitor current $I_{Ca1}$ is measured. During the measurement, the voltage $U_{aG}$ applied to the b wire constantly rises from the negative area up to a predeterminable positive value.

After this maximum value has been reached, the voltage $U_{aG}$ is then kept constant (phase III). During the third phase, too, the ohmic leakage current is now measured. Thus, a second value is obtained for the leakage current, called $I_{Ra2}$ in this case.

To conclude the measurement, the applied voltage $U_{aG}$ is constantly reduced in phase IV. During this process, the current variation of the capacitive current of the subscriber line, here called $I_{ca2}$, is measured a second time. Starting from a predetermined positive value, the voltage $U_{aG}$ then decreases to a predetermined negative value.

From these four values $I_{Ra1}$, $I_{Ra2}$, $I_{Ca1}$ and $I_{ca2}$ detected during the measurement, leakage resistance and transmission-line constant of the a wire of the subscriber line can then be determined. To determine the corresponding values for the second wire b of the subscriber line, the steps described above are carried out with correspondingly exchanged starting positions.

As already mentioned above, the disadvantageous factor in the method described above for RC measurement is the fact that the ringer capacitance arranged between the two wires a and b falsifies the values for $I_{Ra1}$ and $I_{Ra2}$, respectively.

SUMMARY

Exemplary embodiments in the present disclosure are aimed at improving the ways for determining the leakage resistance of at least one wire of a subscriber line having a number of wires in a communication network.

In an exemplary method for determining the leakage resistance of at least one wire of a subscriber line having a number of wires in a communication network, a capacitance which can be arranged between the at least one wire and a further wire is discharged before the determination of the leakage resistance of the at least one wire.

The capacitance is preferably discharged by applying a decreasing voltage to the at least one wire and applying a rising voltage to the other wire and subsequently switching the further wire to high impedance.

Using this process, the final values of the decreasing voltage and of the rising voltage are advantageously selected in such a manner that the voltage on the further wire is 0 volts after the further wire has been switched to high impedance.

Under another exemplary embodiment, the leakage resistance of the at least one wire is determined after the further wire has been switched to high impedance.

In addition, the leakage resistance is advantageously determined by at least one measurement of the leakage current on the one wire of the subscriber line, the at least one measurement of the leakage current advantageously being performed with a constant applied voltage.

Advantageously, two measurements of the leakage current are further performed, the capacitance being discharged again before the second measurement.

Further advantageous embodiments and a device for determining the leakage resistance of at least one wire of a subscriber line having a number of wires in a communication network will be understood by those skilled in the art in light of the disclosure herein.

BRIEF DESCRIPTION OF THE DRAWINGS

The various objects, advantages and novel features of the present disclosure will be more readily apprehended from the following Detailed Description when read in conjunction with the enclosed drawings, in which:

FIG. 1 illustrates a basic diagrammatic structure of a current analog subscriber connection of a telephone network;

FIG. 2 illustrates a variation with time of a method for determining the leakage resistance and the transmission-line constant on the a wire of a subscriber line according to the prior art; and FIG. 3 illustrates a variation with time under an exemplary embodiment for determining leakage resistance, wherein, a transmission-line constant on the a wire is additionally determined in accordance with a conventional method of a subscriber line.

DETAILED DESCRIPTION

FIG. 3 shows the variation with time of the method for determining the resistance between wire and ground of a subscriber line under an exemplary embodiment. The method is described here by way of example by using a combined determination of leakage resistance and transmission-line constant (RC measurement) of the a wire of a subscriber line comprising two wires (a and b).

Both a wire and b wire of the subscriber line are switched to low impedance at the beginning. In the first step (phase I), a constantly decreasing voltage $U_{aG}$ (illustrated by a continuous line) is applied to the wire a to be measured, wherein, due to the coupling of the two wires a and b, the voltage $U_{bG}$ (illustrated by a dashed line) on the second wire b has a corresponding, constantly rising variation at the same time. The two voltages $U_{aG}$ and $U_{bG}$, respectively, in each case reach a predeterminable final value.

At the beginning of phase II, wire b is then switched to high impedance. By suitably selecting the final or target voltages set in the first step, the voltage $U_{bG}$ wire to ground) drops to 0 volts due to this switching of the b wire to high impedance as a result of which capacitance C is discharged. At the same time, a corresponding drop in the voltage $U_{aG}$ (a wire to ground) to a lower, negative level occurs. The voltage $U_{aG}$ is then kept constantly at the said level and a first measurement of the ohmic current on the a wire $I_{Ra1}$ is performed.

After the conclusion of this measurement, a constantly rising voltage is applied to wire a (phase III) until the voltage $U_{aG}$ has reached a predeterminable positive value. During this voltage increase on wire a, the variation of the capacitive current $I_{Ca1}$ on this wire is measured. Due to the increasing voltage on the a wire, the voltage $U_{bG}$ between b wire and ground increases at the same time (dashed line) as shown in FIG. 3.

After the conclusion of the measurement of $I_{Ca1}$ and after the maximum voltage has been reached, the b wire of the subscriber line is switched to low impedance again at the beginning of phase IV. By switching to low impedance, wire b is pulled to a lower voltage level, on the one hand, whilst $U_{aG}$ also drops, on the other hand. In this case, the voltage between wire and ground ($U_{aG}$) drops to a negative voltage value.

Following this, according to the exemplary method, the same procedure as in phase I is adopted for a second measurement of the leakage current—but with opposite signs. In other words, in phase IV, a constantly rising voltage is applied to wire a as a result of which wire b is supplied with a constantly dropping voltage at the same time. In this example, both voltages $U_{aG}$ and $U_{bG}$ pass through the zero point and finally in each case reach a predeterminable target value as final voltages.

In phase V, wire b is then switched to high impedance again. A suitable adjustment of the final or peak voltages of $U_{aG}$ and $U_{bG}$ in phase IV leads to the voltage of b wire to ground $U_{bG}$ again being pulled to 0 volts. At the same time, voltage $U_{aG}$ (voltage between a wire and ground) rises to a correspondingly higher value. Following this new switching of the b wire to high impedance, the voltage $U_{aG}$ is kept constant and a second measurement of the ohmic current $I_{Ra2}$ is performed. In this second measurement, too, the following applies: $U_{bG}$=0 volts.

Finally, a constantly dropping voltage is applied to wire a in phase VI. During this phase, a second measurement of the capacitive current $I_{Ca2}$ on the a wire is carried out whilst the a wire to ground voltage $U_{aG}$ decreases down to a predeterminable negative value.

Following the sequence of the method according to the invention, the values of the leakage resistance and the transmission-line constant of the a wire of the subscriber line can be determined in conventional manner from the detected measurement values $I_{Ra1}$, $I_{Ra2}$ and $I_{Ca2}$. As mentioned above, this method according to the invention does not result in any faulty measurements of the ohmic currents $I_{Ra1}$ and $I_{Ra2}$, respectively, since the ringer capacitance C is in each case discharged before the currents are measured.

To determine the values for the b wire, that is to say to perform a corresponding RC measurement of the b wire, the method described above can also be used correspondingly on the second wire b of the subscriber line.

While the invention has been described with reference to one or more exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

The invention claimed is:

1. A method for determining a leakage resistance of at least one wire of a subscriber line, comprising the steps of:
   discharging existing capacitance arranged between the at least one wire of a plurality of wires in the subscriber line of a communication network, and a further wire in the subscriber line, wherein the capacitance being discharged by applying a decreasing voltage to the at least one wire, and applying a rising voltage to the further wire, and subsequently switching the further wire to a high impedance; and
   determining the leakage resistance of the at least one wire, wherein the determining step occurs after the discharging step.

2. The method as claimed in claim 1, wherein the final values of the decreasing voltage and of the rising voltage are selected in such a manner that the voltage on the further wire is 0 volts after the further wire has been switched to high impedance.

3. The method as claimed in claim 1, wherein a leakage resistance of the at least one wire is determined after the further wire has been switched to high impedance.

4. The method as claimed in claim 3, wherein the leakage resistance is determined by at least one measurement of the leakage current on the one wire of the subscriber line.

5. The method as claimed in claim 4, wherein the at least one measurement of the leakage current is performed with a constant applied voltage.

6. The method as claimed in claim 5, wherein two measurements of the leakage current are performed, the capacitance being discharged again before the second measurement.

7. The method as claimed in claim 6, wherein the capacitance is discharged again before the second measurement by applying a rising voltage to the at least one wire and applying a decreasing voltage to the further wire and switching the second wire to high impedance.

8. The method as claimed in claim 7, wherein final values of the rising voltage and of the falling voltage are selected in such a manner that the voltage on the further wire is 0 volts after the further wire has been switched to high impedance.

9. The method as claimed in claim 1, wherein the leakage resistance is determined as part of a determination of leakage resistance and transmission-line constant of the subscriber line.

10. An apparatus for determining a leakage resistance of at least one wire of a subscriber line, comprising:
   means for applying a voltage;
   means for discharging existing capacitance arranged between the at least one wire of a plurality of wires in the subscriber line of a communication network, and a further wire in the subscriber line;
   the means for applying the voltage disposed in such a manner that the capacitance is discharged by applying a decreasing voltage to the at least one wire and applying a rising voltage to the further wire and subsequently switching the further wire to a high impedance; and
   means for determining the leakage resistance of the at least one wire, wherein the leakage resistance is determined after the existing capacitance is discharged.

11. The apparatus according to claim 10, wherein the means for applying a voltage is arranged in such a manner that the final values of the decreasing voltage and of the rising voltage are selected in such a manner that the voltage on the further wire is 0 volts after the further wire has been switched to high impedance.

12. The apparatus according to claim 10, further comprising a current measuring device, wherein the current measuring device is arranged in such a manner that, for determining the leakage resistance, the leakage current on the one wire of the subscriber line is measured at least once.

\* \* \* \* \*